United States Patent
Amir

(10) Patent No.: US 6,933,449 B2
(45) Date of Patent: Aug. 23, 2005

(54) SELECTIVE AREA SOLDER PLACEMENT

(75) Inventor: Dudi Amir, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 345 days.

(21) Appl. No.: 10/192,346

(22) Filed: Jul. 10, 2002

(65) Prior Publication Data

US 2004/0007385 A1 Jan. 15, 2004

(51) Int. Cl.$^7$ .............................................. H05K 1/16
(52) U.S. Cl. ...................... 174/260; 174/262; 174/265; 361/779; 228/56.3
(58) Field of Search ................................. 174/261, 260, 174/256, 265, 263, 257; 361/760, 767, 779, 751, 683, 728, 752; 228/56.3, 180

(56) References Cited

U.S. PATENT DOCUMENTS

| | | | |
|---|---|---|---|
| 5,070,604 A | * 12/1991 | Banba et al. | 29/837 |
| 5,242,097 A | * 9/1993 | Socha | 228/56.3 |
| 5,296,649 A | * 3/1994 | Kosuga et al. | 174/250 |
| 5,373,984 A | 12/1994 | Wentworth | 228/180.1 |
| 6,179,631 B1 | * 1/2001 | Downes et al. | 439/83 |
| 6,181,565 B1 | * 1/2001 | Schmitt et al. | 361/756 |
| 6,273,327 B1 | 8/2001 | Murray, Jr. et al. | 228/245 |
| 6,680,843 B2 | * 1/2004 | Farrow et al. | 361/681 |

FOREIGN PATENT DOCUMENTS

| | | | |
|---|---|---|---|
| JP | 05-198932 | 8/1993 | ........... H05K/3/34 |
| JP | 06-275944 | 9/1994 | ........... H05K/3/34 |
| JP | 07-038246 | 2/1995 | ........... H05K/3/34 |
| JP | 08-274454 | 10/1996 | ........... H05K/3/34 |
| JP | 10-244395 | 9/1998 | ........... B23K/35/14 |
| JP | 11-019792 | 1/1999 | ........... B23K/35/14 |
| JP | 2001-015901 | 1/2001 | ........... H05K/3/34 |
| JP | 2001-237535 | 8/2001 | ........... H05K/3/34 |

OTHER PUBLICATIONS

Computer translation of Japanese Patent Publicatin No. 07038246 (admitted prior art submitted by the applicant).*
Computer translation of Japaneses Patent Publicatin No. 10244395 (admitted prior art submitted by the applicant).*

* cited by examiner

Primary Examiner—Kamand Cuneo
Assistant Examiner—Ishwar (I.B.) Patel
(74) Attorney, Agent, or Firm—Schwegman, Lundberg, Woessner & Kluth, P.A.

(57) ABSTRACT

A printed circuit board having at least one layer of conductive traces on an external surface has at least one preformed solder element placed on a conductive trace area of the printed circuit board requiring a greater than standard amount of solder. The at least one preformed solder element is reflowed to form a connection with the layer of printed solder.

8 Claims, 3 Drawing Sheets

SELECTIVE AREA SOLDER PLACEMENT

FIELD OF THE INVENTION

The invention relates generally to electronic printed circuit boards, and more specifically to placing solder deposits on the printed circuit board.

BACKGROUND OF THE INVENTION

Electronic components are typically assembled into complex circuits by mounting them on printed circuit boards. These printed circuit boards are usually flat nonconductive boards with one or more layers of a conductive material such as copper fixed on or in the printed circuit board. The layers of copper are etched or otherwise formed to specific shapes and patterns in the manufacturing process, such that the remaining conductive copper traces are routed to connect electrical components to be attached to the printed circuit board.

It is not uncommon for printed circuit boards such as these to have copper layers on both a top and bottom side of the circuit board, but also several layers of copper traces or patterns sandwiched at various depths within the circuit board itself. These traces allow greater flexibility in circuit routing, and usually allow designing a more compact circuit board for a particular circuit than would otherwise be possible. The various layers are sometimes dedicated to particular purposes, such as a ground layer that only serves to distribute ground or signal return connections to various components.

Circuit board layers that serve to connect components to other components often must connect to components attached to a different layer (top or bottom), or such layers must be attached to each other at selected points, requiring use of what are commonly known as vias. These vias typically are essentially small conductive plated-through hole elements oriented perpendicular to the top and bottom surfaces of a circuit board that extend through at least two conductive layers of the circuit board, and that electrically connect circuit traces on at least two of the conductive layers to each other. These vias may be filled with solder during the solder printing process of printed circuit board fabrication, if a method is used that enables application of sufficient solder to fill the hole.

Connection of components such as through-hole mounted (THM) components or solder-connected shields to the printed circuit board can also require a relatively large amount of solder to ensure a reliable connection, and therefore ideally will use more solder than a typical printed circuit board printing process will provide. Some ceramic components such as ball-grid arrays (BGAs) or other surface mount devices may also benefit from more solder than is typically ideal for most of the rest of a printed circuit board, further evidencing a need for application of a relatively large amount of solder to selected areas of a circuit board.

Solutions to this need for additional solder on some certain areas of printed circuit boards typically involve increasing the density of the solder applied to all areas of the board in the solder printing process, or use of various types of stencil to apply additional solder to the board. But, because of the fine pitch of interconnects and component connection pads on many printed circuit boards, application of a relatively large amount of solder throughout a circuit board is not desirable because it tends to cause solder bridging between traces and pads on the circuit board. Similarly, use of thick stencils requires a spacing of typically 4 mm around the area to which solder is to be applied, can impact other surface mount components on the circuit board, and is rather limited in the amount of solder than can be applied. Overprint stencils are further limited in the solder volume that can be applied, and so are also undesirable for many applications.

All current known solutions to the need for additional solder on certain areas of a printed circuit board involve the printing process, and are limited by the technology of the solder printing apparatus which was not designed to vary the amount of solder printed across a circuit board. Use of stencils and extra-thick solder application are not appropriate solutions for applications involving fine pitch circuit traces and pads, or for many surface mount technology applications.

What is needed is a technology enabling selective application of an amount of solder greater than is normally applied in a solder printing process to selective areas of a printed circuit board.

DETAILED DESCRIPTION

In the following detailed description of sample embodiments of the invention, reference is made to the accompanying drawings which form a part hereof, and in which is shown by way of illustration specific sample embodiments in which the invention may be practiced. These embodiments are described in sufficient detail to enable those skilled in the art to practice the invention, and it is to be understood that other embodiments may be utilized and that logical, mechanical, electrical, and other changes may be made without departing from the spirit or scope of the present invention. The following detailed description is, therefore, not to be taken in a limiting sense, and the scope of the invention is defined only by the appended claims.

The present invention provides in various embodiments a technology enabling selective application of an amount of solder greater than is normally applied in a solder printing process to selective areas of a printed circuit board by placement of preformed solder elements to the printed solder layer on a printed circuit board. The preformed solder element is reflowed, connecting the printed circuit board's conductive traces to electrical components.

Figure 1:
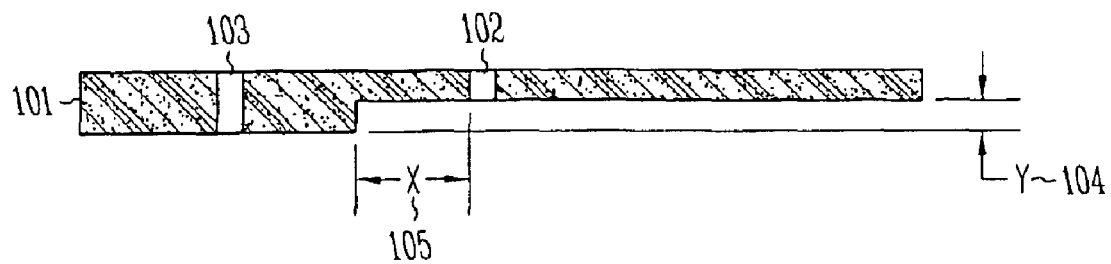
FIG. 1 shows a stepped stencil for use in applying solder to a printed circuit board, consistent with the prior art.

FIG. 1 illustrates a prior art method of applying large amounts of solder to a printed circuit board. The stencil 101 has openings 102 and 103 through which solder is applied. The solder flows into the cavities formed by the holes 102 and 103 in the stencil, and is restricted from flowing out the bottom of the stencil by contact between the stencil and a circuit board. Because the stencil is thicker at 103 than at 102, a greater amount of solder will be applied to the underlying circuit board structure at 103 that at 102. The ability to vary the amount of solder applied to circuit board features in this manner is limited to approximately a 0.004 inch change in stencil thickness, as pictured in the 'Y' dimension shown at 104. Further, the step in the stencil will cause a greater amount of solder than is applied at 102 to be applied in other apertures within about 0.04 inches of the change in stencil thickness, shown in the 'X' direction at 105. These limitations not only restrict the amount of solder that can be applied with this method, but impose design restrictions on the rate at which solder thickness can be changed across a circuit board.

Figure 2:
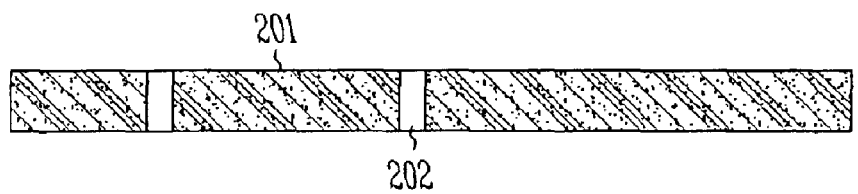
FIG. 2 shows an overprint stencil for use in applying solder to a printed circuit board, consistent with the prior art.

FIG. 2 shows an overprint stencil 201 for use in applying solder to a printed circuit board. Solder is simply printed through stencil opening 202, which is greater in width than the underlying circuit board feature, which is therefore overprinted with solder. The amount of overprinting that can be practically achieved with a stencil such as 201 is limited by the amount of solder pullback that can be reliably expected after solder printing, which limits overprinting to within about 7 mm of a printed circuit board feature needing a greater than standard amount of solder. The amount of solder applied is also limited in some instances by the relative narrow size of the opening 202 and limited practical thickness of the stencil, or by the aperture of openings 202.

Figure 3:
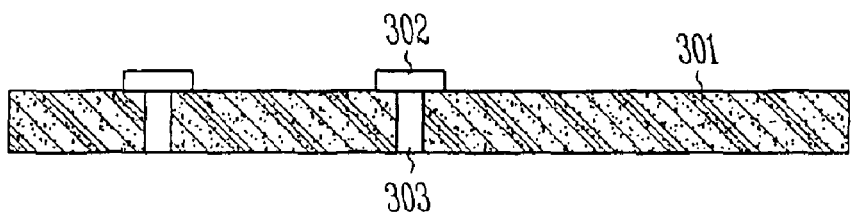
FIG. 3 shows a printed circuit board printed with a thin layer of solder, consistent with an embodiment of the present invention.

FIG. 3 illustrates printing a first layer of solder to a printed circuit board 301 with a conventional printing process. The thickness of the solder 302 that is applied is limited by the printing equipment such as the stencil thickness, and is practically limited by the pitch of the narrow, dense circuit board traces and pads. The solder 302 illustrated here is applied to a pad surrounding through-hole 303 in the printed circuit board.

Figure 4:
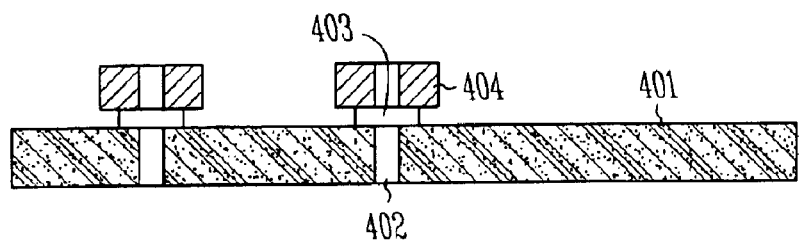
FIG. 4 shows a printed circuit board with a printed layer of thin solder and a preformed solder element placed on the printed layer, consistent with an embodiment of the present invention.

FIG. 4 shows how one embodiment of the present invention's use of preformed solder elements allows application of a greater amount of solder than was possible with other methods. Printed circuit board 401 has though holes such as 402 covered with solder paste 403. The solder paste acts as a sticky adhesive to which preformed solder element 404 is placed such as by using standard electronic component placement equipment. This placement equipment may include a standard chip shooter, a fine pitch pick and place machine, a standard or specially designed vacuum nozzle, or any other method of placing a component on a circuit board. The solder element 404 is here a washer-shaped solder element with a hole in the middle, placed so that the hole in the middle of the solder element is aligned with the through hole 402 of the printed circuit board. The solder element may take any shape, including solid shapes such as rectangles, cylinders, or spheres, or other shapes that are not solid such as washers, toroids, and rectangles with holes.

Figure 5:
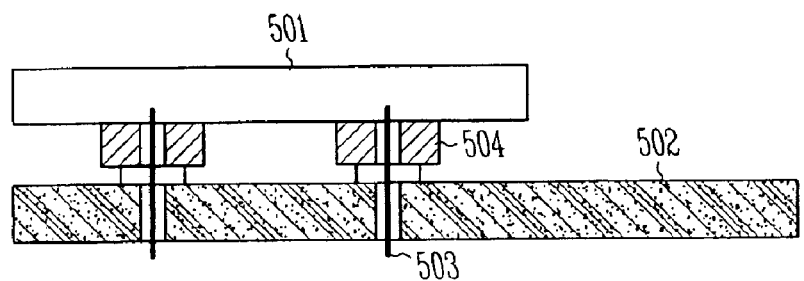
FIG. 5 shows an electronic component placed on a printed circuit board with preformed solder elements, consistent with an embodiment of the present invention.

FIG. 5 shows how an electrical component such as a connector 501 can then be applied to a circuit board with preformed solder elements such as was shown in FIG. 4. Here, the connector 501 is placed on the printed circuit board 502 such that the pins of the connector 503 extend through the through hole 402 and the hole in the washer-shaped preformed solder element 504. The preformed solder element 504 is then heated or reflowed so that the solder melts, forming an electrical connection between the connector component 501 and conductive traces on the printed circuit board. The preformed solder element 504 therefore serves to provide a greater amount of solder to the area of connection between connector 501 and the conductive trace on circuit board 502 than is standard, such as by typical solder printing methods.

Figure 6:
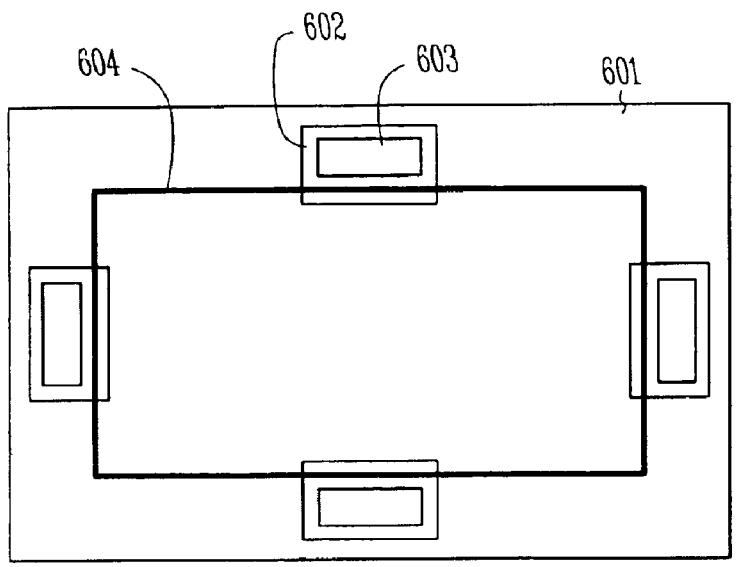
FIG. 6 shows a printed circuit board with a shield attached thereto and having preformed solder elements placed thereon, consistent with an embodiment of the present invention.

FIG. 6 illustrates how such solder elements can be placed in another application to support a shield element on a printed circuit board. Here, a printed circuit board 601 shown from the top has upon it several copper traces 602 electrically connected to a ground potential. A preformed solder element 603 is placed on each copper trace adjacent to its point of connection to the attached shield 604. The solder is heated or flowed to cause it to both physically and electrically connect the shield 604 to the copper traces 602 on the circuit board 601.

Figure 7:
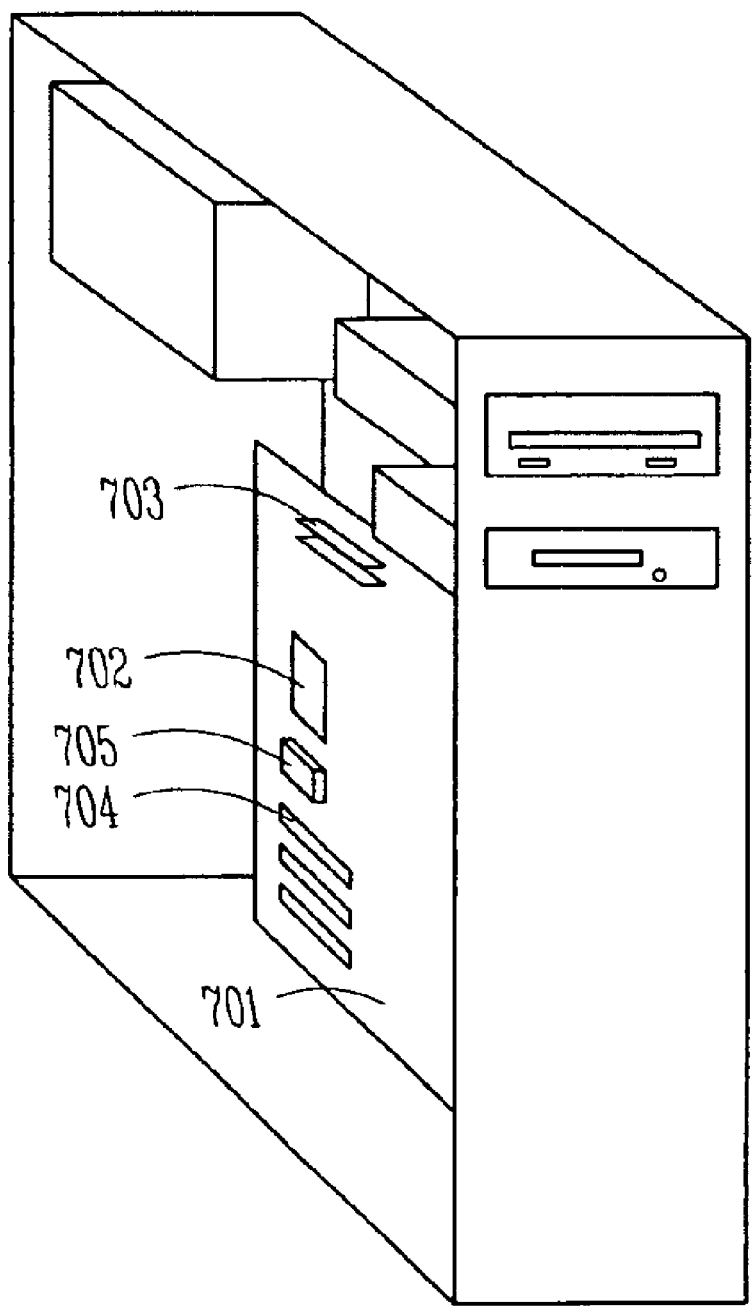
FIG. 7 shows a computer system, consistent with an embodiment of the present invention.

FIG. 7 illustrates a computerized system, consistent with an embodiment of the invention. A motherboard 701 has various components attached thereto, including a processor 702, memory 703, and expansion slots 704. The motherboard of one embodiment of the invention comprises at least one preformed solder element used to supply a greater than standard amount of solder for attachment of one or more components such as sockets for memory 703 or expansion slots 704 to the motherboard. In another embodiment of the invention, one or more solder elements are used to attach a shield, such as shield 705, to the motherboard.

It has been shown in these examples how placement of a preformed solder element, such as with an electrical component pick-and-place machine, easily and efficiently provides additional solder to regions of a printed circuit board such as physically large connection points that require more solder than is applied in a typical solder printing system. The embodiments of the inventive method described herein allows a greater amount of solder to be placed than do other traditional methods such as overprinting, and can be implemented largely using existing equipment.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the invention. It is intended that this invention be limited only by the claims, and the full scope of equivalents thereof.

What is claimed is:

1. A printed circuit board, comprising,
    at least one layer of conductive traces on an external layer of the printed circuit board;
    a layer of printed solder applied to conductive trace areas of the printed circuit board requiring a standard amount of solder;
    at least one preformed solder element, each of the at least one preformed solder elements placed on a conductive trace area of the printed circuit board requiring a greater than standard amount of solder, wherein the at least one preformed solder element has an unfilled hole passing through the element such that a conductive element of a component is received placed through the unfilled hole, and wherein the preformed solder element is reflowed to form a connection with the layer of printed solder and the conductive element of the component.

2. The printed circuit board of claim 1, wherein the at least one preformed solder element is a rectangular solder element.

3. The printed circuit board of claim 1, wherein the at least one solder element is placed on a conductive trace area of the printed circuit board using electronic component placement equipment.

4. The printed circuit board of claim 1, wherein the at least one solder element is reflowed after placement of components on the printed circuit board.

5. The printed circuit board of claim 4, wherein the reflow forms a connection between the layer of printed solder, the at least one solder element, and a component placed on the printed circuit board.

6. A computerized system, comprising:

a processor;

a motherboard;

at least one layer of conductive traces on an external layer of the motherboard;

a layer of printed solder applied to conductive trace areas of the motherboard requiring a standard amount of solder;

at least one preformed solder element, each of the at least one preformed solder elements placed on a conductive trace area of the motherboard requiring a greater than standard amount of solder, wherein the at least one preformed solder element has an unfilled hole passing through the element such that a conductive element of a component can be placed through the unfilled hole, and wherein the preformed solder element is reflowed to form a connection with the layer of printed solder and the conductive element of the component.

7. The computerized system of claim 6, wherein the at least one solder element is reflowed after placement of components on the motherboard.

8. The computerized system of claim 7, wherein the reflow forms a connection between the layer of printed solder, the at least one solder element, and a component placed on the motherboard.

* * * * *